US008886495B2

(12) United States Patent
Bertozzi et al.

(10) Patent No.: US 8,886,495 B2
(45) Date of Patent: Nov. 11, 2014

(54) DIAGNOSTIC METHODS AND APPARATUS FOR AN ACCELERATOR USING INDUCTION TO GENERATE AN ELECTRIC FIELD WITH A LOCALIZED CURL

(71) Applicant: Passport Systems, Inc., Billerica, MA (US)

(72) Inventors: William Bertozzi, Lexington, MA (US); Robert J. Ledoux, Harvard, MA (US)

(73) Assignee: Passport Systems, Inc., Billerica, MA (US)

( * ) Notice: Subject to any disclaimer, the term of this patent is extended or adjusted under 35 U.S.C. 154(b) by 0 days.

(21) Appl. No.: 13/633,434

(22) Filed: Oct. 2, 2012

(65) Prior Publication Data

US 2013/0099801 A1 Apr. 25, 2013

Related U.S. Application Data

(63) Continuation of application No. 12/351,241, filed on Jan. 9, 2009, now Pat. No. 8,280,684.

(60) Provisional application No. 61/019,944, filed on Jan. 9, 2008, provisional application No. 61/019,958, filed on Jan. 9, 2008.

(51) Int. Cl.
*G06F 11/30* (2006.01)
*H01J 23/00* (2006.01)
*G01R 27/26* (2006.01)
*H05H 7/00* (2006.01)

(52) U.S. Cl.
CPC ............. *G01R 27/2611* (2013.01); *H05H 7/00* (2013.01)
USPC .......................................... 702/183; 315/507

(58) Field of Classification Search
USPC ........... 702/183, 1, 57, 60, 64–67, 69–70, 81, 702/84, 127–128, 150–153, 156–157, 182, 702/189–190; 324/149, 559, 600, 603, 605, 324/609, 611, 631, 633, 636, 652–655, 658, 324/660–661, 695–696, 701–702; 376/112–113, 121, 127, 133, 142, 150; 250/491.1, 493.1, 496.1, 497.1; 315/500–507
See application file for complete search history.

(56) References Cited

U.S. PATENT DOCUMENTS 8,280,684 B2 * 10/2012 Bertozzi et al. ................ 702/183
2007/0001128 A1 * 1/2007 Sliski et al. ................ 250/492.3

FOREIGN PATENT DOCUMENTS

EP 0481865 A1 4/1992

OTHER PUBLICATIONS

Serianni et al., Development, Tests, and Data Acquisition of the Integrated System of Internal Sensors for RFX, Oct. 2004, Review of Scientific Instruments, vol. 75, No. 10, pp. 4338-4340.*

(Continued)

*Primary Examiner* — Toan Le
(74) *Attorney, Agent, or Firm* — Stephen B. Deutsch; Peter K. Sollins; Foley Hoag LLP

(57) ABSTRACT

Methods and apparatus are described wherein a charged beam in an enclosed conducting cavity in an accelerator is monitored for position, current, and energy. One method uses induced electric signals on non-intercepting conducting electrodes. Another method uses an intercepting and moving electrode than can be moved into the beam to different degrees to monitor the beam current and vertical profile at different radial positions. Non-intercepting electrodes are also used as part of a moving diagnostic probe to monitor properties of the beam at different radial positions. Another method uses the current in the leads to a power supply, a portion of this current being equal to the beam current. Another method uses the magnetic and electric fields from the beam that penetrates a non-conducting portion of the conducting cavity. Yet another method uses the radiation emitted during acceleration of the beam by the deflecting magnets that guide the beam.

2 Claims, 6 Drawing Sheets

(56) References Cited

OTHER PUBLICATIONS

Badano et al. "Proton-Ion Medical Machine Study (PIMMS) Part I, Contents Part I," Cern Report, vol. 310, (Jan. 2, 1999), XP055117582.
Badano et al. "Proton-Ion Medical Machine Study (PIMMS) Part II," (Jan. 1, 2000), XP055117316, Geneva, Switzerland, Retrieved from the Internet: URL:http:/fcds.cern.chirecord/449577/files/ps-2000-007.pdf, [retrieved on May 12, 2014].
Boucher et al. "High average current betatrons for industrial and security applications," Proceedings of the 2001 Particle Accelerator Conference, IEEE, Chicago, (Jun. 25, 2007), pp. 3835-3837, XP831227424, ISBN: 978-1-4244-8916-7.
European Search Report for EP09700266, dated May 30, 2014.

* cited by examiner

DIAGNOSTIC METHODS AND APPARATUS FOR AN ACCELERATOR USING INDUCTION TO GENERATE AN ELECTRIC FIELD WITH A LOCALIZED CURL

CROSS-REFERENCE TO RELATED APPLICATION

This present application claims priority to and the benefit of U.S. patent application Ser. No. 12/351,241 entitled "Diagnostic Methods for an Accelerator Using Induction to Generate an Electric Field with Localized Curl" which was filed on Jan. 9, 2009 by William Bertozzi and Robert J. Ledoux, now U.S. Pat. No. 8,280,684. U.S. patent application Ser. No. 12/351, 241 claims priority to and the benefit of (1) U.S. Provisional Patent Application Ser. No. 61/019,958 entitled "Diagnostic Methods for an Accelerator Using Induction to Generate an Electric Field with a Curl Localized at a Gap" which was filed on Jan. 9, 2008 by William Bertozzi and Robert J. Ledoux, and which is hereby incorporated by reference; and (2) U.S. Provisional Patent Application Ser. No. 61/019,944 entitled "Method for Accelerating Particles Using Induction to Generate an Electric Field with a Curl Localized at a Gap" which was also filed on Jan. 9, 2008 by William Bertozzi, Stephen E. Korbly and Robert J. Ledoux, and which is hereby also incorporated by reference.

FIELD

A novel configuration for a particle beam accelerator is described in U.S. Pat. No. 8,264,173, "Methods and Systems for Accelerating Particles Using Induction to Generate an Electric Field with a Localized Curl" by William Bertozzi, Stephen E. Korbly and Robert J. Ledoux. That patent is hereby incorporated by reference. The accelerator may have a vacuum chamber that is annular or toroidal in shape and which serves as the accelerator beamline. The beamline has an electrically conductive part and an electrically non-conductive part that serves as an acceleration gap. A magnetic field that is present in the region of the vacuum chamber controls the motion of the beam within the vacuum chamber. The accelerator has two very distinct electromagnetic field regions. One is inside the vacuum chamber/beamline where the only fields other than the magnetic guide fields are those created by the accelerating potential in the region of the non-conducting acceleration gap and those induced by the beam charge on the inner walls of the conductive portion of the vacuum chamber/beamline. The other electromagnetic field region is outside the vacuum chamber/beamline where an exciting current travels along the outside surface of the conductive portion of the vacuum chamber/beamline. These two regions are coupled only via the non-conducting acceleration gap. The present disclosure teaches methods and systems for monitoring the beam and the beam performance in the novel accelerator. Certain of these methods and systems may also be applied in other types of accelerators.

BACKGROUND

Particle accelerators generally are grouped into different categories according to their fundamental concepts:
1) Those that use constant electrostatic fields such as Van de Graaff accelerators;
2) Those that make use of radiofrequency cavities in a straight line such as linear accelerators;
3) Those that use the electric fields induced by a time varying magnetic field to accelerate a particle such as the betatron; and
4) Circular accelerators that recirculate the beam of particles through a radiofrequency cavity to reach a desired energy such as a cyclotron, synchrotron, microtron, racetrack microtron or RHODOTRON™ electron beam accelerator.

Different names have been used to describe different combinations of the ideas represented by these categories and the concepts they represent, as they have been perceived to be advantageous in different applications. Many are discussed in books about accelerator design such as M. S. Livingston and J. P. Blewett, "*Particle Accelerators*", McGraw Hill Book Company, Inc., New York, 1962. They all apply the fundamental Maxwell equations and particle dynamics in magnetic and electric fields to accelerate particles and to form accelerated beams.

Most particle accelerators having a degree of complexity require methods and systems for monitoring and controlling the beams they produce. Such systems are often referred to as diagnostic systems or simply "diagnostics". In the case of the novel accelerator partly described herein and more fully described in U.S. Pat. No. 8,264,173, "Methods and Systems for Accelerating Particles Using Induction to Generate an Electric Field with a Localized Curl" by William Bertozzi, Stephen E. Korbly and Robert J. Ledoux, the specific characteristics of the accelerator introduces unique requirements for the processes of monitoring and controlling the beam. Because the beam mostly travels inside an electrically conductive enclosure except at an accelerating gap, it is not readily accessible for diagnostic measurements. Conventional methods of monitoring a beam in such a case include the use of intercepting beam stops located at different positions in the beam orbits or probes that can sense the beam location and/or size and that can be moved within the vacuum chamber. These conventional techniques require vacuum couplings and/or feedthroughs for movable probes. Disclosed herein are techniques and apparatus that are particularly adapted to the novel accelerator design. Certain of these techniques and apparatus also are suitable for use with other accelerator types.

SUMMARY

Like other categories of accelerator, the accelerator disclosed in U.S. Pat. No. 8,264,173, "Methods and Systems for Accelerating Particles Using Induction to Generate an Electric Field with a Localized Curl" by William Bertozzi, Stephen E. Korbly and Robert J. Ledoux, also uses the governing rules of Maxwell's equations, but in a novel approach that cannot be equated with any of the concepts or applications of the conventional particle accelerator groups listed above. The essential elements of this accelerator are:
1) A magnetic core that can accommodate a time varying B-field;
2) A power supply that can provide suitable voltages and currents.
3) An electrically conductive vacuum chamber that encircles a portion of the magnetic core and that has a non-conducting gap; and
4) A magnetic guide field to guide the particles around the interior of the vacuum chamber in stable orbits as they gain energy.

According to the methods and systems described in detail in U.S. Pat. No. 8,264,173, "Methods and Systems for Accelerating Particles Using Induction to Generate an Electric Field with a Localized Curl" by William Bertozzi, Stephen E.

Korbly and Robert J. Ledoux, any charged particle can be accelerated, and any energy within wide limits is possible, the limits being imposed only by the practical limits of the state-of-the-art for electrical insulation, power supply capabilities, magnets, etc. The method achieves large beam currents at high duty cycles approaching 100%. No radio frequency power generators feeding tuned cavities are required. A voltage supply may provide the energy to the beam. Energy is delivered to the particles via coupling to an electric field that possesses a Curl at a gap.

Because of the characteristics of this accelerator, it is a challenge to monitor the processes of injection, capture, acceleration to the final beam energy and extraction because of the electromagnetic separation of the interior and exterior regions of the vacuum chamber. Some standard ways of monitoring the beam are to use intercepting beam stops located at different positions of the beam orbits or moveable or fixed beam probes capable of sending signals generated by induction or beam interception. These techniques require vacuum couplings for fixed and/or movable probes. We include such methods herein as a disclosure. In order to avoid interception of the beam, non-intercepting transducing elements are preferred for observing signals from the relevant phases of the beam production process. Various signals, therefore, must be derived in order to allow the status of the beam to be monitored. Accordingly it is an object of this disclosure to provide diagnostics, measurement systems, and control systems for injecting, accelerating, propagating, and extracting a charged particle beam in the exemplary novel accelerator, recognizing that certain methods and apparatus disclosed may also have broader application.

DETAILED DESCRIPTION OF EMBODIMENTS

The methods and apparatus disclosed herein may assist in diagnosing the quality of operation during the initial tune up of an accelerator, during the standard operation of the accelerator, and for the control of the desired beam parameters such as energy, intensity and time structure.

The disclosed methods and apparatus for monitoring the acceleration of beams and the properties of the beams employ couplings to a charged particle beam via electric and magnetic fields, the image current flowing in cavity walls and the radiation emitted during the acceleration process. The methods and apparatus may be applicable to many acceleration methods. The exemplary disclosure herein is for a novel accelerator that delivers energy to particles via the coupling to an electric field that possesses a curl at a gap and image charges flowing in conductive walls, but the methods are not limited to such acceleration alone. They are more general and their applicability to other accelerator modalities will be recognized by those experienced in the art and are intended to be encompassed in this disclosure.

To monitor the operation of an accelerator the diagnostic elements may be matched to the dynamical behavior of the accelerator and its electric and magnetic features as well as the nature of the particles being accelerated. The success of injection, capture and acceleration to final beam energy may require monitoring of the beam parameters at several stages of the acceleration process. The monitoring methods may indicate the quality of the parameters of the beam such as energy and intensity during different stages of the process. Thus, the diagnostic elements may be designed in accordance with those of the accelerator itself and the nature of its components and their operation.

Figure 1:
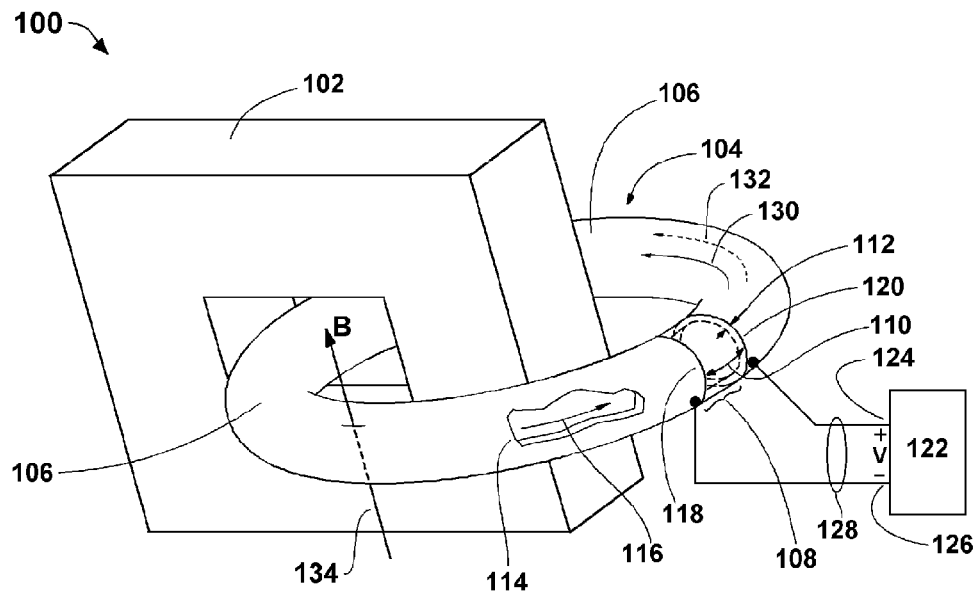
FIG. 1 shows one embodiment of a system illustrating details of an accelerator with a power supply disposed across a non-conducting gap of a vacuum chamber for use with certain of the diagnostic methods and apparatus disclosed herein.

FIG. 1 is a schematic 100 of an embodiment of an exemplary accelerator for use with the diagnostic techniques disclosed herein. This accelerator is disclosed in U.S. Pat. No. 8,264,173, "Methods and Systems for Accelerating Particles Using Induction to Generate an Electric Field with a Localized Curl" by William Bertozzi, Stephen E. Korbly and Robert J. Ledoux. A vacuum chamber 104 serves as a beamline and has an electrically conductive portion 106 and an electrically non-conductive portion that will be referred to as non-conducting gap 108. The vacuum chamber 104 may be generally tubular in cross-section (circular or rectangular, or other cross section) and may be toroidal in form, such as the circularly annular form illustrated, or may have some other closed path connection that permits cyclic/circulating passage of a beam within. A cutaway 114 provides a view of a beam of charged particles 116 cycling within the vacuum chamber 104. The beam 116 is for example (not limitation) an electron beam and has one or more electrons moving, for example, in the direction indicated by the arrow. The cutaway 114 is for illustrative purposes only and does not represent an actual opening in the vacuum chamber 104. The non-conducting gap 108 has a gap length d 110. The conductive portion 106 of the vacuum chamber 104 has a wall thickness w 112. A magnetic guide field 134 is a B-field and guides beam particles in a beam 116 through the vacuum chamber 104 along a closed cyclic path. The magnetic guide field 134 is only indicated schematically as a single flux line, but it is recognized that the magnetic guide field may be complex, may be generated by multiple magnetic elements (not shown) and may pass through multiple or all parts of the vacuum chamber 104 to effectively guide and/or focus the beam 116. The vacuum chamber 104 surrounds a portion of an induction core 102. The conductive portion 106 of the vacuum chamber 104 has two ends 118, 120 that are separated by the non-conducting gap 108. The joints between the ends 118 and 120 of the conducting portion 106 and the non-conducting gap 108 portion are sealed by conventional vacuum sealing techniques. Electrical leads 128 connect the ends 118 and 120 to a power supply 122. Power supply 122 has a first terminal 124 that may be a positive terminal and which is connected to end 120. Power supply 122 has a second terminal 126 that may be a negative terminal and which is connected to end 118. Power supply 122 provides a voltage V that may be a time varying voltage and that may oscillate and reverse polarity periodically in a square wave fashion or with some other suitable waveform.

As an aid to understanding the operation of the accelerator in FIG. 1, temporarily consider an idealized situation wherein the conductive portion 106 of vacuum chamber 104 is considered to be a perfect conductor in a circular path around the portion of the induction core 102. Temporarily consider the power supply 122 to be an idealized voltage source characterized as having zero input or output impedance. When the power supply is connected to the ends 118 and 120 of the conductive portion 106 of the vacuum chamber 104, (and thus also across the non-conducting gap 108 of the vacuum chamber 104) a current given by $dI_O/dt=V/L$ flows in the conductive portion 106, where L, the inductance of the one-turn circuit formed by the conductive portion 106, is determined by the magnetic properties of the induction core 102 composition and geometric aspects of the inductance such as the cross-sectional area of the induction core 102. The boundary conditions imposed by Maxwell's equations demand that the current $I_O$ 130 through the conductive portion 106 be on the outer surface of the conductive portion 106 of the vacuum chamber 104. Inside the vacuum chamber 104 there is no electric or magnetic field as a result of the applied voltage V or the current $I_O$ except in the region of the non-conducting gap 108 where the electric field, $E_G$, is given by geometry to be approximately V/d where d is the gap length d 110 of the non-conducting gap 108. The role of the induction core 102 is to provide a finite inductive impedance that is coupled to the power supply 122, limiting the current $I_O$ 130 by $dI_O/dt=V/L$.

Still considering the idealized situation, a charged particle (charge q) traversing the non-conducting gap 108 in the vacuum chamber 104 will be accelerated with an energy gain of qV. This particle is guided around the induction core 102 inside the vacuum chamber 104 by an appropriate magnetic guide field 134. The particle experiences no retarding fields in the vacuum chamber 104 because all fields (except for the static magnetic guide field as discussed below) are zero except for those induced on the walls by the charge of the particle itself. As the particle travels around the induction core 102 it reenters and traverses the non-conducting gap 108 in the vacuum chamber 104 and its energy is increased by qV again. If it makes n circuits (or turns through the gap) it gains a total energy nqV. The path integral around the inside of the vacuum chamber 104 of E·dl in one complete path is V. Here, E is the electric field in the vacuum chamber 104 and dl represents the path length differential for the beam path (bold quantities are used to represent vectors). E is zero in the conductive portion 106 and is equal to $E_G$ in the non-conducting gap 108. It should be recognized that $E_G$ is a complex function of position in the region of the non-conducting gap and not a constant as implied by the approximate relation $E_G=V/d$. It is not described in detail herein for the purposes of simplifying the discussion. However, regardless of this complex variation, most of the field $E_G$ is located in the vicinity of the non-conducting gap and the path integral of E·dl in one complete path is rigorously V. That is, this electric field has a Curl for its vector character. This distinguishes this electric field from an electrostatic field where the integral of E·dl around a closed path is zero. Conventional means (not shown) are employed for injecting and/or extracting the beam 116 into/from the vacuum chamber 104 according to techniques that will be well known to those familiar with the art.

Thus there are two very distinct electromagnetic field regions in this idealized situation. One is inside the vacuum chamber 104 where the only fields are those created by V in the region of the non-conducting gap 108, those induced by the particle charge q on the inner walls of the conductive portion 106 of the vacuum chamber 104, and those constituting the magnetic guide fields. The other field region is outside the conductive portion 106 of the vacuum chamber 104 where the current $I_O$ 130 from $dI_O/dt=V/L$ travels along the outside surface of the conductive portion 106. These two regions are coupled only via the non-conducting gap 108.

Still considering the idealized situation, an induced image charge on the inner surface of the conductive portion 106 of the vacuum chamber 104 forms current $I_I$ 132 and travels along the inner surface in the same direction as the path of the particle(s) in the beam 116. Current $I_I$ 132 is equal to the rate of flow of charge of the particle(s) in magnitude and opposite in sign. When the particle(s) is for example an electron(s) this image charge is positive. When the particle(s) in the beam 116 reaches the end 118 of the conductive portion 106 at the non-conducting gap 108 it simply crosses the non-conducting gap 108 in the vacuum and gains energy qV. However, the induced image charge (and thus the current $I_I$ 132) has no alternative but to come to the outer surface of the conductive portion 106. Upon reaching the outer surface at the end 118, the current $I_I$ 132 travels through electrical leads 128 and through the power supply 122, which has an ideally zero impedance. Thus, in this example, the current $I_I$ 132 resulting from the image charge flows through the power supply 122, electrical leads 128, and enters the inner wall of the conductive portion 106 of vacuum chamber 104 at the end 120, adjacent to the non-conducting gap 108 with the voltage +V and exits at the inner wall of the conductive portion 106 at the end 118, where the voltage is zero, and returns to the power supply 122. The image charge flow provides an additional current $I_I$ 132 flow into the power supply equal to the current flow of the beam 116. The image charge flow is an image current. Thus, the power supply provides power to energize the induction core 102 and additionally it provides power to the beam 116 via this coupling with the image charge or image current.

Thus far in this discussion the conductive portion 106 has been considered as ideal with no resistive impedance. In the real (non-idealized) situation, finite resistance must be considered in the working exemplary accelerator of this disclosure. This situation is well treated in many texts on electromagnetic theory. Referring to the book by J. D. Jackson ("*Classical Electrodynamics*", Third Edition, John Wiley & Sons, 1999) the subject is treated in several places. In particular, in Chapters 5 and 8 it is shown that the main effect of the finite conductivity is to localize the currents and fields to a region of the surface called the "skin thickness". This means that fields that vanished at the surface of the idealized perfect conductor now penetrate the real conductor of this working accelerator, but die away as $e^{-x/\delta}$ where x is the distance perpendicular to the surface and δ is the skin thickness. The value of δ depends on the resistivity of the conductive portion 106 of the vacuum chamber 104 and the frequency of the external relevant electromagnetic fields considered. As an example, at 2.5 KHz for copper, δ is approximately 1.3 mm. By assuring that the wall thickness w 112 of the conductive portion 106 is considerably larger than δ, the inner and outer regions of the vacuum chamber remain effectively decoupled electromagnetically. The non-conducting gap 108, however, still causes the flow of the image charge current $I_I$ 132 from the +V side of the power supply 122 into the inner surface of the conductive portion 106 of the vacuum chamber 104 and the flow of the image charge current $I_I$ 132 out of the inner surface of the conductive portion 106 into the low potential side of the power supply 122. In the real situation, the Ohmic resistance to the flow of the current $I_I$ 132 and the current $I_O$ 130 are no longer zero (as in the idealized situation discussed above) in the conductive portion 106, but can be evaluated using standard expressions of current flow through a medium with resistivity ρ with the current distributed in the skin thicknesses of the inner and outer surfaces as described above. Generally, for good conductors such as copper and for geometries and values of δ at the frequencies considered herein, these losses may be low compared to power consumption by other elements.

The coupling of the power supply 122 to the beam 116 in the vacuum chamber 104 through the image charge flowing into the vacuum chamber 104 via the ends 118, 120 of the conductive portion 106 at the non-conducting gap 108 cannot be represented by standard fixed electrical circuit parameters. However, an equivalent electrical circuit can be constructed to illustrate the functional behavior described herein. This is shown in FIG. 2.

Figure 2:
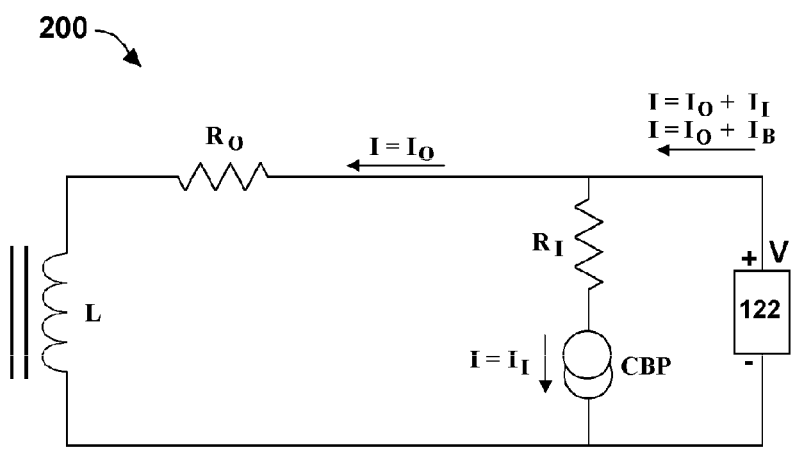
FIG. 2 shows an approximate equivalent circuit of the embodiment shown in FIG. 1.

FIG. 2 is an approximate equivalent circuit schematic 200 of the accelerator shown in FIG. 1. Referring to FIGS. 1 and 2, the inductance of the one-turn coil formed by the conductive portion 106 the vacuum chamber 104 around the induction core 102 is represented by the symbol L in schematic 200. The energy dissipation of the outer surface current $I_O$ 130 due to finite conductivity of the conductive portion 106 is represented by the current, $I_O$, flowing through the resistance $R_O$ in schematic 200. This current, $I_O$, is governed by Equation 1:

$$V - L dI_O/dt - I_O R_O = 0 \quad \text{(Equation 1)}$$

The energy dissipation of the induced image current $I_I$ 132 in the inside of the conductive portion is noted by the current, $I_I$, flowing through a resistance given by the symbol $R_I$ in schematic 200. The symbol CBP denotes the beam coupling of the beam 116 to the power supply 122 via the induced image current $I_I$ 132 on the inside of the conductive portion 106. This induced image current is given by $I_I = I_B$, where $I_B$ is the circulating beam current inside the vacuum chamber 104 due to the beam 116. The image current $I_I$ 132 is supplied by the power supply 122 via the beam coupling CBP through the non-conducting gap 108. The total power supply 122 current is:

$$I = I_O + I_I = I_O + I_B \quad \text{(Equation 2)}$$

Thus the total current from the power supply 122 is the sum of the current $I_O$ 130 exciting a magnetic flux in the induction core 102 and the current $I_B$ due to the beam 116. The power supply 122 supplies energy to the magnetic field in the induction core 102 and to the beam 116. If the beam 116 is not present, only the magnetic energy is supplied. The power supplied by the power supply 122 is given by $P = V(I_O + I_B)$. In any practical situation, the losses due to the dissipation in $R_O$ and $R_I$ are small compared to the dissipation in the magnetic induction core 102 due to hysteresis and internal currents and therefore the Ohmic losses may be neglected. The dissipation in $R_I$ causes a decrease in the energy gain of the circulating beam 116. In general this decrease is much smaller than the qV beam energy gain for each cycle and may again be neglected in terms of beam dynamics except in evaluating the final particle energy.

Referring again to FIG. 1, one exemplary configuration of the accelerator described above is shown. The induction core 102 forms a complete magnetic circuit. The vacuum chamber 104 provides an evacuated region for the beam 116 to circulate about the induction core 102. The beam 116 is guided by magnetic guide field 134 that constrains all beam orbits to lie within the confines of the vacuum chamber 104. The vacuum chamber 104 encircles (though not necessarily of circular shape) the induction core 102. The current $I_O$ 130 flows on the outer surface of the conductive portion 106 of vacuum chamber 104. The non-conducting gap 108 has a power supply 122 connected across it. The currents $I_O$ 130 and $I_B$=current $I_I$ 132 flow out of the first terminal 124 of power supply 122 (positive terminal) and into the second terminal 126 of the power supply 122 (negative terminal). In FIG. 1, the power supply 122 presents a voltage V across its terminals 124, 126 as discussed above and the characterization of the first terminal 124 as + and the second terminal 126 as − only implies that the + is at a higher potential than the − terminal when V is positive.

For an accelerator similar to that of system 100 (FIG. 1), it is a challenge to monitor the processes of injection, capture, acceleration to the final beam energy and extraction because of the electromagnetic separation of the interior and exterior regions of the vacuum chamber. One way of monitoring the beam is to use intercepting beam stops located at different positions of the beam orbits. This technique requires employing vacuum-tight couplings for operating fixed and movable probes inside the vacuum chamber from outside. We include such methods herein as a disclosure. In order to avoid interception of the beam, non-intercepting transducing elements may be employed to observe and forward signals from the relevant phases of the beam production process. These elements may obtain magnetically and electrically induced signals and may involve fixed and movable vacuum-tight couplings.

The processes of injection and capture are critical to the success of the accelerator. An electron gun, for example, may be present at an inner radius and may produce a beam of particles (1) that are synchronized with the application of the voltage V to the non-conducting gap of the accelerating cavity and (2) that lasts for a duration determined by the application at hand. In one embodiment, this may be a short burst of particles, such that the burst has ended before the leading edge completes one circuit of the vacuum chamber. In another embodiment this may be a long burst of particles lasting as long as the sweep of the induction core from $-B_C$ to $+B_C$, where $B_C$ is the maximum field in the induction core; in some cases it may be desirable that $B_C$ may approach or reach core saturation.

The critical period for injection and capture may encompass a few to a dozen circuits or turns of the vacuum chamber by the injected beam, such that if those circuits have been successfully negotiated the beam is considered captured; if this number of circuits were not achieved it would be important to understand where and when the injected beam had been lost.

When captured, the beam progresses to be accelerated to full energy. However, due to imperfections in the patterns of the guiding magnetic fields and other design parameters, a portion of the beam or the entire beam may be lost on its way to gaining the final energy. Knowing when and where this loss occurs is essential to diagnosing the problem and developing adjustments to mitigate or correct the situation.

Extraction of the beam at full energy may also require special magnetic and/or electric signals to be applied to the beam to kick it out of a stable orbit to be captured by an extraction system. Thus, having a signal or signals that establish that the beam has reached full energy is also important.

During routine operation of the accelerator, beam characteristics may be affected by many variables, such as but not limited to temperature and voltage fluctuations, environmental changes and unexpected inadvertencies.

Having methods for monitoring and diagnosing the characteristics of the beam at all phases of operation is important. Methods and apparatus are disclosed herein whereby signals from non-intercepting and intercepting transducing elements allow various attributes of the beam in the accelerator to be determined, such as:

1.) the number of circuits or turns of the vacuum chamber executed;
2.) the energy of the beam at each location of interest;
3.) the intensity of the beam at each circuit or turn and location;
4.) the motion of the beam about its equilibrium orbit;
5.) the locations and times at which beam losses occur;
6.) the effects of space charge on beam intensity and orbital motion;
7.) the quality of operation of the accelerator and the effects of mitigation strategies for perturbations; and
8.) the effective duty cycle of the extracted beam.

The embodiments described herein are exemplary of possible applications of the technology disclosed herein for the monitoring of charged particles during acceleration. Although the embodiments are taught in application to a few specific exemplary accelerator types, it is recognized that they have broader applicability. Those experienced in the art will recognize that there are extensions, modifications and other arrangements of the important elements disclosed that can be implemented and they are intended to be encompassed in the scope of this disclosure.

In one embodiment the transducing element consists of conducting electrodes that do not intercept the beam, placed at different locations in the chamber out of the path of the particle beam. Such an exemplary embodiment is shown in FIGS. 3A and 3B.

Figure 3A:
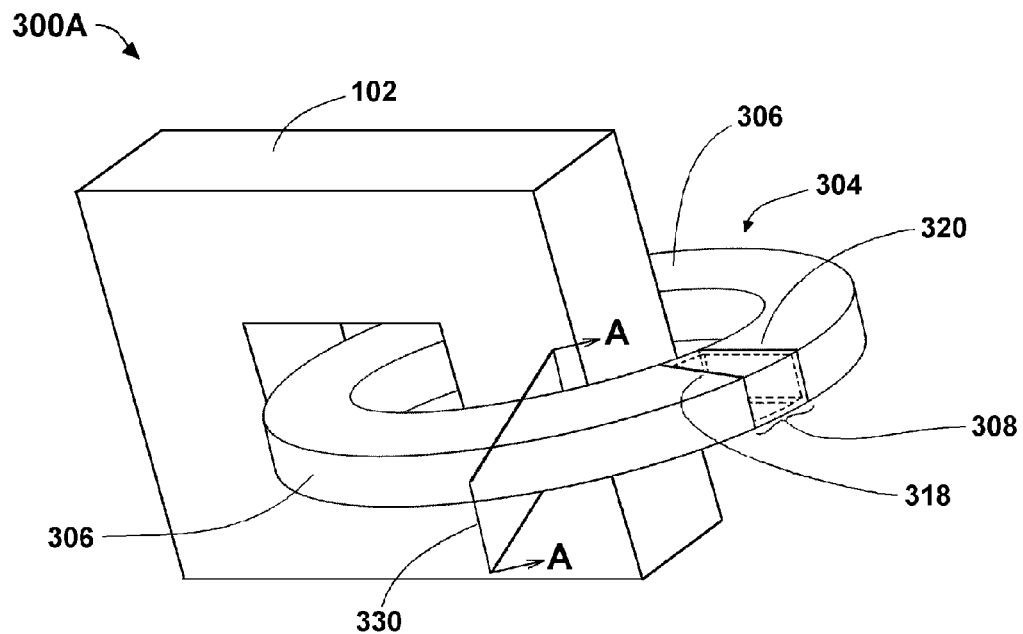
FIG. 3A shows one embodiment of a system similar to the system of FIG. 1 and having a vacuum chamber with a rectangular cross-section.

FIG. 3A is a diagram 300A illustrating a system 300 of an exemplary accelerator similar in construction and operation to that shown in FIG. 1, except that the vacuum chamber 304 is (for example, not for limitation) rectangular in cross-section. The vacuum chamber 304 serves as a beamline and has an electrically conductive portion 306 and an electrically non-conductive portion (referred to as a non-conducting gap) 308. The conductive portion 306 of the vacuum chamber 304 has two ends 318, 320 that are separated by the non-conducting gap 308, which is used as an acceleration gap. The joints between the ends 318 and 320 of the conducting portion 306 and the non-conducting gap 308 portion are sealed by conventional vacuum sealing techniques. An imaginary cutting plane 330 defines the location of a cross-sectional view in the direction A-A as indicated, cutting the electrically conductive portion 306 of the vacuum chamber 304. The accelerator has an inductive core 102.

Figure 3B:
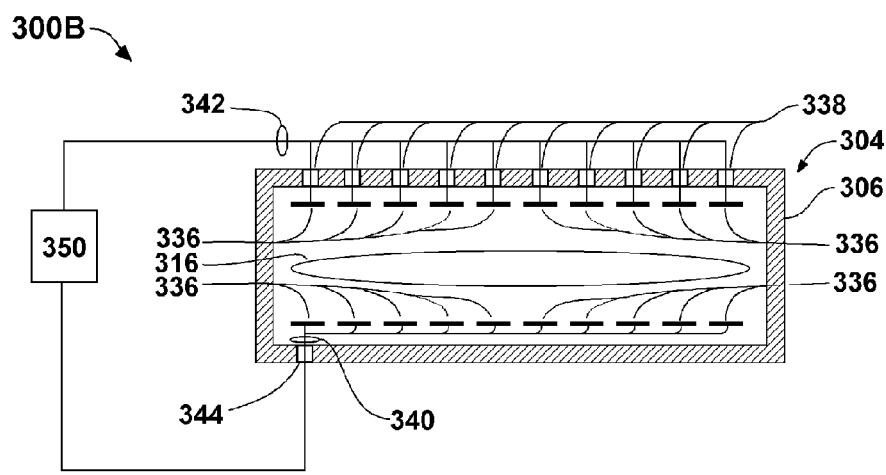
FIG. 3B shows a cross-sectional view of a portion of the system of FIG. 3A, illustrating an embodiment of the diagnostic methods and apparatus disclosed herein.

FIG. 3B is a cross-sectional view 300B of a portion of the system 300 of FIG. 3A, showing the conductive portion 306 of the vacuum chamber 304, taken at the cutting plane 330 (FIG. 3A) looking in the direction A-A (of FIG. 3A) and showing additional detail not shown in FIG. 3A.

Referring to FIG. 3B, the conductive portion 306 of the vacuum chamber 304 encloses a beam 316 traveling into the plane of the paper and indicated in this view by its cross-sectional profile (elliptical, for example). One or more conducting electrodes 336 are mounted within the conductive portion 306 of the vacuum chamber 304. The conductive electrodes 336 are isolated electrically from the walls of the conductive portion 306 of the vacuum chamber 304 by conventional means (not shown) and are provided with external connections through the walls of the chamber. The conductive electrodes 336 may be multiple and may be arranged in a regular array (as shown) or another pattern as may be desired and may be arranged on one or more sides of the beam 316. Each of the conductive electrodes 336 has an electrical lead for connection. Each lead may pass through the conductive portion 306 of the vacuum chamber 304 through a single-lead hermetic feedthrough 338 as indicated for leads at the top of the conductive portion 306. In that case leads 342 may connect to instrumentation 350 for monitoring and analyzing signals from the conductive electrodes 336 conveyed by the electrical leads 342. Alternatively, the leads may be bundled into a cable 340 and pass through the conductive portion 306 of the vacuum chamber 304 through a multi-lead hermetic feedthrough 344 as indicated for the leads at the bottom of the conductive portion 306. In that case the leads in cable 340 may also connect to instrumentation 350 for monitoring and analyzing signals from the conductive electrodes 336. (Of course, either single-lead feedthroughs, one or more multi-lead feedthroughs, or a combination thereof may be used.) The instrumentation is designed so that the conductive electrodes 336, may each present high (relative to other conductive paths of the system) resistive impedances to current flow. Each conductive electrode 336 will receive an induced voltage, $V_I$, created by the image charge, q, from the beam passing nearby. This $V_I$ will be induced according to the standard rules of electromagnetism and will depend on q, distributed capacity and the impedance of the circuit. This $V_I$ presents a signal that a certain amount of beam charge has reached a specific location in the vacuum chamber 304 at a specific time. Instrumentation 350 may consist of purpose-built instruments and/or may comprise a general purpose microprocessing system.

This diagnostic scheme provides the following information on accelerator performance:

1.) A beam charge pulse that lasts less that the time for one turn will show up (depending upon the electrode placement and spacing) as a signal on one or a few of the conductive electrodes 336 that couple via the induced charge. These signals convey information to determine the position of the beam 316 as it orbits around the vacuum chamber 304, and as the pulses are counted they may establish the number of turns (circuits of the vacuum chamber 304) having been executed and the losses from each turn. The amplitude oscillations of the beam about the equilibrium orbit may be determined as well, and the changes in orbit position as the beam is accelerated on each pass through the accelerating region at the non-conducting gap 308 of the vacuum chamber 304. By counting the number of pulses in the signals induced on the pads the number of circuits or turns is determined, and thus the energy of the beam may be known at any time because the energy gain is qV for each turn (where the charge of the particles is q). Similarly, it can be established when the beam 316 has reached the full energy. The correlation of energy and conductive electrode 336 position can also be used as a diagnostic method. If the beam is lost in some region of the vacuum chamber 304, this position may be determined, as may be the onset of beam loss by the changing amplitude of the signals for successive turns.

2.) The beam pulse may be longer than in the above case, as by injection continuing until the full energy is reached for the first particles injected. In this case, the progression of the beam 316 through the acceleration process still can be monitored by the timing and amplitude of the signals induced on the conductive electrodes 336. This allows monitoring the entire acceleration process with an accelerating chamber full of charge. The beam 316 will have components at all energies from that of injection up to that of extraction and different conductive electrodes 336 will have signals induced from beam components at different energies. This allows the additional monitoring of the effects of the interaction of different components of the beam via space charge effects and the generation of ions in the residual gas in the vacuum chamber 304.

3.) The beam pulse may be longer than the time required for acceleration to full energy, in order to achieve higher beam duty cycle. In this case, the signals on the conductive electrodes 336 will allow a determination of the quality of operation during the full duty cycle and will provide an opportunity to control and adjust beam quality.

Figure 4:
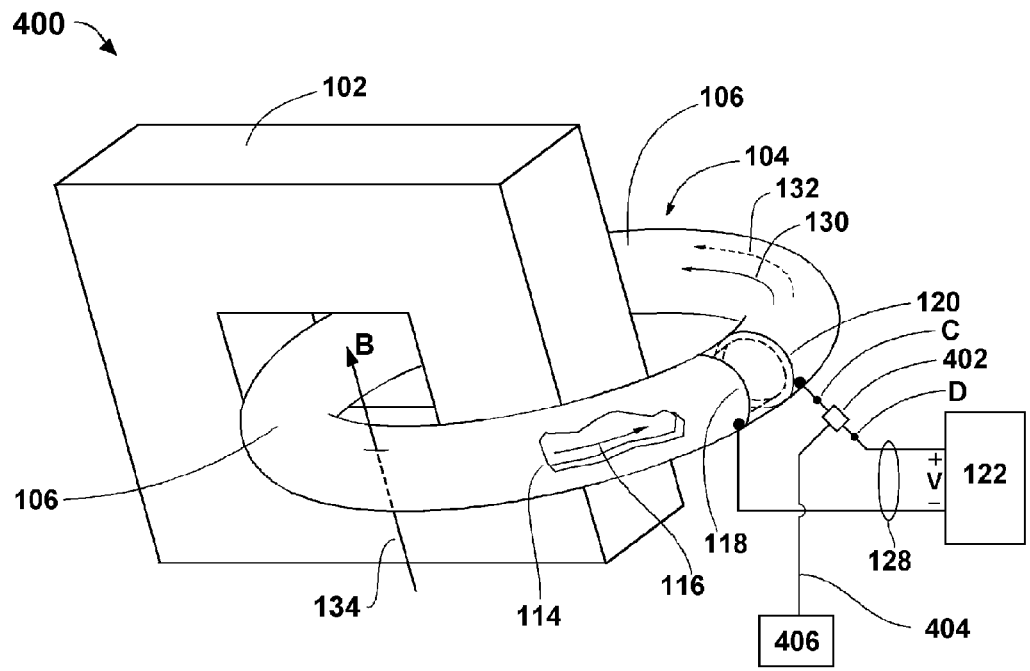
FIG. 4 shows another embodiment including a current sensor for detecting the current in the power supply leads.

FIG. 4 is a diagram of a system 400 comprising an exemplary accelerator similar to that in FIG. 1 with the embodiment of a current sensor for detecting the current flowing to the power supply 122 for the accelerator. In FIG. 4, items with like reference numbers to those in FIG. 1 are like items with like functions. A transducing element may measure the current flowing to the power supply 122 from the conducting portion 106 of the vacuum chamber 104. Referring to FIG. 4, by introducing a current sensor 402 in either of the electrical leads 128 connecting the power supply 122 to the ends 118, 120 of the conductive portion 106 of the vacuum chamber, the total current $I=I_O+I_B$ can be measured (see the circuit shown in FIG. 2). The current sensor 402 may be connected, for example, at connection points C and D. This current sensor may be a low impedance resistor in the power supply 122 electrical leads 128; the voltage across this resistor would indicate the current passing through the electrical leads 128. (An internal resistance of the power supply 122 with suitable connections may serve the same purpose). A signal representing the current I may be generated by the current sensor 402 and transmitted by electrical lead(s) 404 to instrumentation 406, which may consist of purpose-built instruments and/or may comprise a general purpose microprocessing system for analysis of the current I and for extracting and processing additional information and for decision making.

Figure 5:
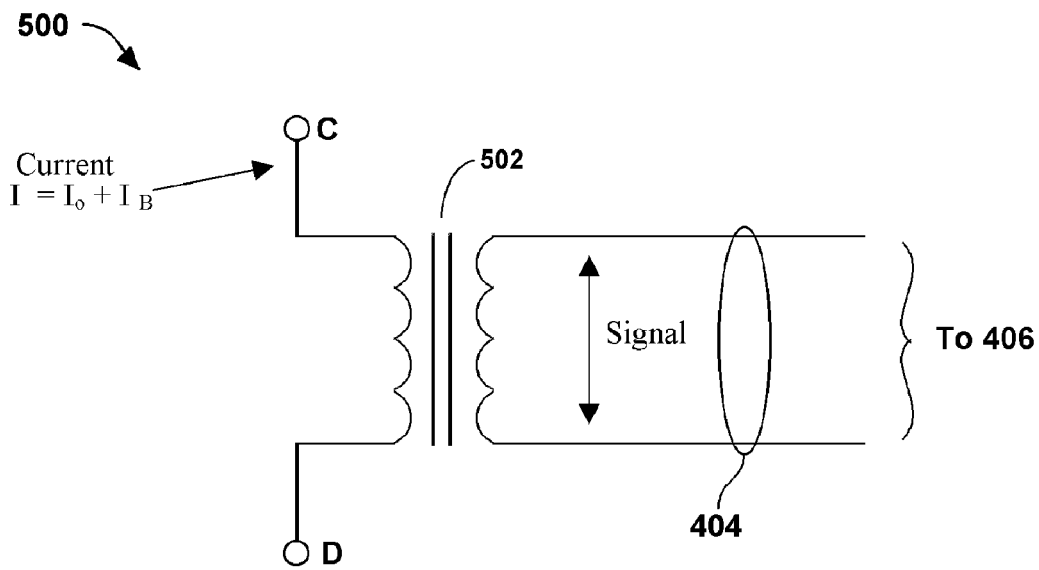
FIG. 5 is a schematic of a circuit of a current sensor for an embodiment.

FIG. 5 is a schematic 500 of a circuit of an alternative current sensor 402 for another current sensor embodiment. Referring now to FIGS. 4 and 5, in this embodiment the current sensor 402 is a transformer 502, for example a toroidal transformer, that senses the magnetic field caused by the current flow I from the power supply 122. The voltage from the transformer 502 depends on the time rate of change of the current I in the electrical leads 128 to the power supply 122. Other methods for sensing the current will be known to those experienced in the art and they are intended to be encompassed in this disclosure.

The signal available from one of these current sensors (a conventional resistive current sensor or the transformer 502) may provide the following diagnostic information:

1.) A beam charge pulse that lasts less that the time for one turn will show up as a current pulse in the power supply lines for each revolution ("turn") of the beam. By counting these pulses the number of turns successfully executed can be determined. The beam energy will be given by the number of turns executed. By measuring the integrated charge of each pulse the beam loss for each turn can be determined. The success of the injection process, the capture process, the acceleration process and the extraction can be monitored for a short beam charge pulse. If there is a loss of beam, the number of turns the beam has executed (and consequently the beam energy) as well as the position of the beam where the loss is taking place can be determined.

2.) The beam may be injected continuously over the time necessary for the maximum energy to be achieved by the first particles injected. In this case the current from the beam grows as the number of revolutions of the beam increases. The current in the power supply lines due to the beam grows accordingly with time. By monitoring the current as a function of time, the condition of the beam at each turn, at each radial position and energy can be monitored.

3.) The beam may be injected continuously over a time greater than that required for the maximum energy to be achieved. In this case the current from the beam grows as the number of revolutions of the beam increases. The current stops growing as the fully accelerated beam is extracted (or as, for example, an internal beam target is used). The current in the power supply lines due to the beam grows accordingly with time and reaches a stable value. By monitoring this current as a function of time, the condition of the beam at each turn and energy is monitored. The effective duty cycle of the beam is determined.

4.) For all beam durations the signals from the current in the lines to the power supply will allow a determination of the condition of the beam as a function of position, time and energy and the correlations will allow a determination of the same effects discussed above for the signals from the conductive electrodes 336 (FIG. 3B).

Figure 6:
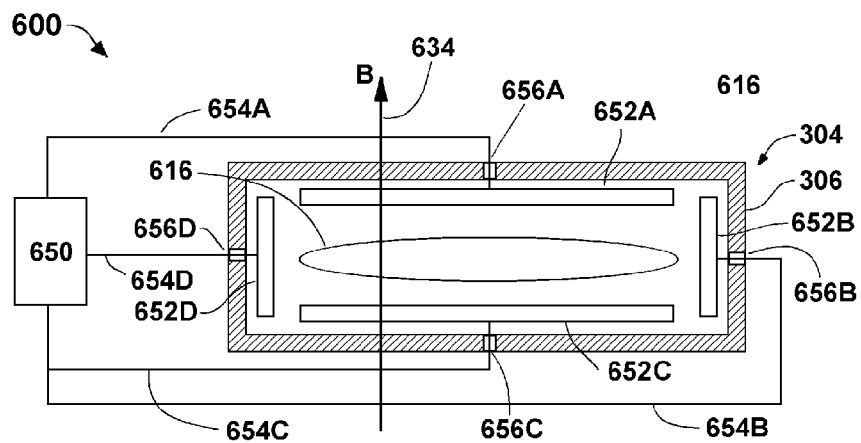
FIG. 6 is a cross-sectional view of a portion of the system shown in FIG. 3A, showing another embodiment employing synchrotron radiation detection.

FIG. 6 is a cross-sectional view 600 of a portion of the system 300 of FIG. 3A, showing the conductive portion 306 of the vacuum chamber 304, taken at the cutting plane 330 (FIG. 3A) and looking in the direction A-A (of FIG. 3A). FIG. 6 shows another embodiment. Referring to FIG. 6, in this embodiment, the beam is monitored through the energy radiated from the acceleration of the particles in the beam 616 as they are deflected by a magnetic guide field 634 (a B-field, schematically indicated without detail) constraining the beam motion within the vacuum chamber 304. The beam 616 is traveling into the plane of the paper and indicated in this view by its cross-sectional profile (elliptical, for example). This radiation resulting from acceleration by deflection in the magnetic guide field 634 is called synchrotron radiation. At energies less than about 10 MeV the radiation does not have a very large effect in perturbing the particle motion. However, the energy radiated as synchrotron radiation is useful in diagnosing the condition of the beam 616 and its energy. The frequency of the synchrotron radiation is related to the frequency of the particle orbital cycling in the vacuum chamber 304 and the intensity of the synchrotron radiation is dependent on the particle acceleration. This topic is covered in detail in several publications and the book by J. D. Jackson ("*Classical Electrodynamics*", Third Edition, John Wiley & Sons, 1999); references therein cover the essential details. Generally, the synchrotron radiation is in the form of high frequency radio waves that can be detected by small loops or probes in the vacuum chamber that do not intercept the beam. The frequencies depend on the geometry of the orbits and their effective radii. To give an example, the frequencies for a 9 MeV electron beam orbiting in a radius of ~1 m. are generally below $10^{13}$ Hz. One or more synchrotron radiation sensors 652A, 652B, 652C, and 652D (identified for example, not for limitation) may be mounted within the conductive portion 306 of the vacuum chamber 304 for detecting synchrotron radiation emitted by the beam 616. The synchrotron radiation sensors 652A, 652B, 652C, and 652D may be for example loops or probes and have electrical leads 654A, 654B, 654C, and 654D respectively for connection to instrumentation 650 for transmitting signals thereto. The electrical leads 654A, 654B, 654C, and 654D pass to the outside of the conductive portion 306 of the vacuum chamber 304 through hermetic electrical feedthroughs electrical leads 656A, 656B, 656C, and 656D respectively. The instrumentation 650 may consist of purpose-built instruments and/or may comprise a general-purpose microprocessing system for analysis of synchrotron radiation signals and for extracting and processing additional information and for decision-making.

These synchrotron radiation signals may provide for the following diagnostic information:

1.) For a beam charge pulse that lasts less than the time for one turn, the radiation emitted and picked up on synchrotron radiation sensors 652A, 652B, 652C, and 652D will also be of a pulsed character and will be correlated to the number of revolutions (turns) the beam 616 has made. By counting these pulses the number of turns successfully executed since injection can be counted. The beam energy is given by the number of turns executed. By measuring the integrated signal of each pulse, the beam loss for each turn can be determined. The signal strength for each turn and the strength of this signal at different frequencies will depend on the beam energy and the radius of the beam orbit. Thus the correlation of number of revolutions and signal strength at different frequencies provides information about the beam charge at different radii and the energy of that charge. The success of the injection process, the capture process, the acceleration process and the extraction can be monitored for a short beam charge pulse. If there is a loss of beam 616, the number of turns the beam has executed prior to loss (and consequently the beam energy at the time of loss) as well as the position of the beam where the loss is taking place can be determined.

2.) The beam 616 may be injected continuously over the time necessary for the maximum energy to be achieved by the first particles injected. In this case the current from the beam 616 grows as the number of revolutions of the beam increases and the radial extent of the beam increases. The intensity of the signals at different frequencies and the time development of these signals provide a monitor of the progress of the beam at different energies and at different locations.

3.) The beam 616 may be injected continuously over a time greater than that required for the maximum energy to be achieved. In this case the current from the beam grows as the number of revolutions of the beam 616 increases. The beam current $I_B$ stops growing as the fully accelerated beam is extracted. The radiofrequency signals radiated by the beam grow accordingly with time and reach a stable value. By monitoring this signal pattern as a function of frequency and time, the condition of the beam 616 at each turn and energy is monitored. The effective duty cycle of the beam 616 is determined.

4.) For all beam durations the radiofrequency signals radiated by the beam 616 will allow a determination of the condition of the beam 616 as a function of position, time and energy and the correlations will allow a determination of the same effects discussed elsewhere herein for the signals from the conductive electrodes (FIG. 3B) and for the signal detectors located on a movable probe (FIGS. 8A, 8B, and 8C).

Figure 7:
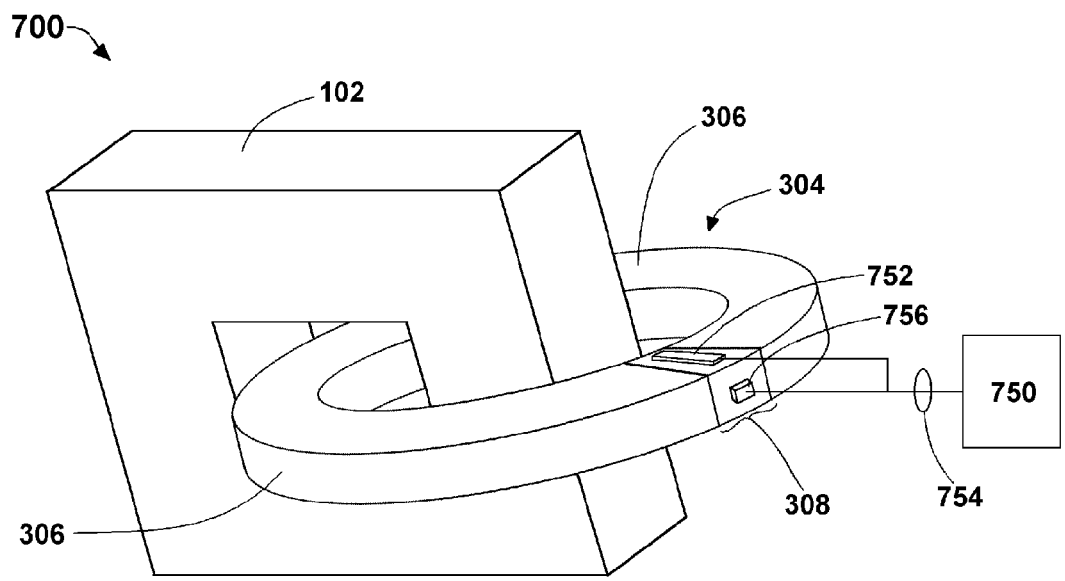
FIG. 7 illustrates another embodiment employing external electromagnetic sensors.

FIG. 7 is a diagram of a system 700 illustrating another embodiment. The accelerator of system 700 is similar to the accelerator of system 300 and in FIG. 7, items with like reference numbers to those in FIGS. 3A and 3B are like items with like functions. In the embodiment shown in FIG. 7, the monitoring of the beam depends on the magnetic and electric fields that originate from the beam and penetrate through the non-conducting gap 308 of the vacuum chamber 304 and which are sensed by one or more external sensors, such as sensors 752 and 756 shown as examples. The strength of these signals depends in detail on the geometry of the system. The one or more external sensors 752 and 756 may be connected by one or more electrical cable 754 to instrumentation 750. The external sensor 752 may be an electrostatic sensor and may have one or more conductive electrodes or an array of conductive electrodes similar to the conductive electrodes 336 of FIG. 3B, discussed above, for receiving induced charge signals. However, the one or more conductive electrodes for this external electrostatic sensor 752 are not in located within the vacuum chamber 304. The resulting information in signals obtained from external electrostatic sensor 752 due to induced charge signals is the same as that provided by the conductive electrodes inside the vacuum chamber 304 of the system 300, except that the location of the external electrostatic sensor 752 is not flexible with respect to azimuth and can only be located near the non-conducting gap 308 of the vacuum chamber 304. The walls of the non-conducting gap 308 may be of a non-magnetic dielectric material. The external sensor 756 is a magnetic sensor and may include probes and or loops for directly sensing magnetic signals related to the beam current, and the coupling to the magnetic fields will be similar to that previously described for the toroidal current sensor used with the power supply lines above, but the coupling is directly with respect to the magnetic fields present. By using multiple external magnetic sensors 756 at different radial locations (not shown) the beam current may be detected at different radii. This adds spatial specificity that is not possible when the power supply current is sensed as described above (for system 400). Otherwise the information is similar to that derived from the currents in the power supply lines described above. The instrumentation 750 may consist of purpose-built instruments and/or may comprise a general-purpose microprocessing system for analysis synchrotron radiation signals and for extracting and processing additional information and for decision-making.

Figure 8A:
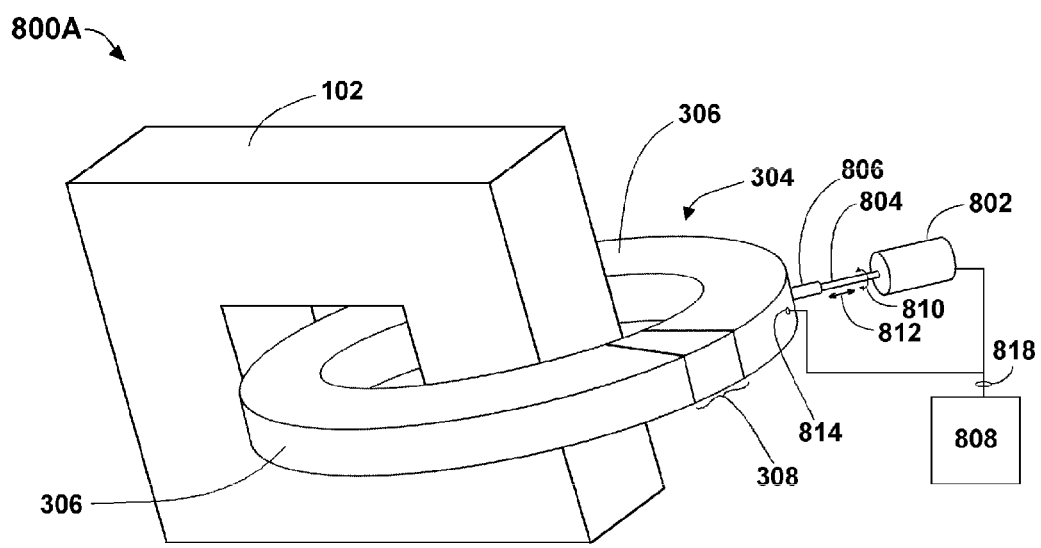
FIG. 8A shows a system similar to the system of FIG. 3A and illustrates another embodiment.

FIG. 8A is a diagram 800A illustrating a system 800 comprising an exemplary accelerator that is similar in construction and operation to that shown in FIG. 3A. Items in FIG. 8A that have reference numbers also shown in FIG. 3A are like items with like functions. Together, FIGS. 8A, 8B, and 8C show an embodiment of a moving diagnostic apparatus for sensing beam properties. FIGS. 8B and 8C are cross-sectional views 800B and 800C respectively of a portion of system 800 showing the conductive portion 306 of the vacuum chamber 304, taken at a cutting plane passing through the vacuum chamber at the location of the moving diagnostic elements.

Figure 8B:
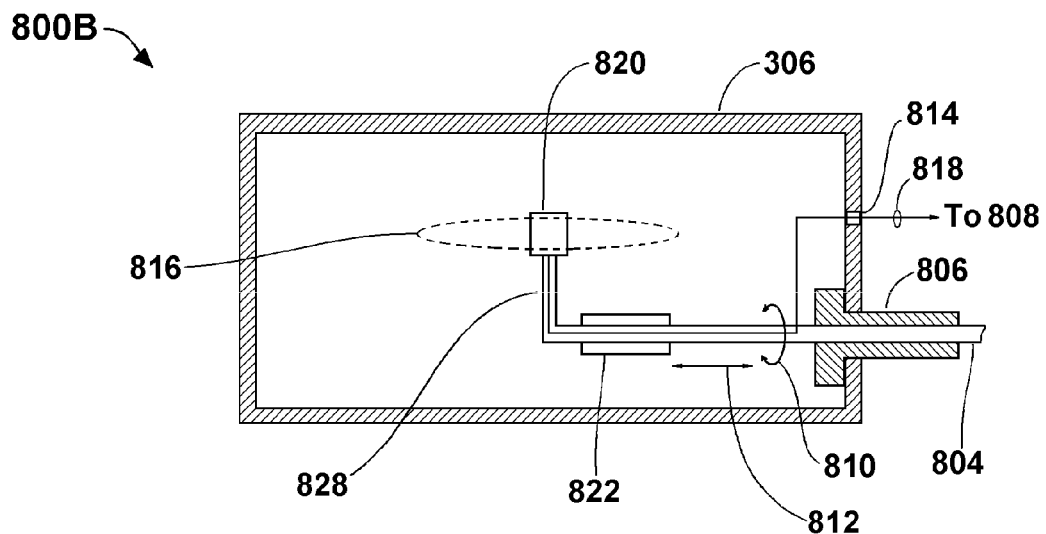
FIG. 8B shows a cross-sectional view of a portion of the system of FIG. 8A, illustrating details of a first operating position of the embodiment of that figure.
Figure 8C:
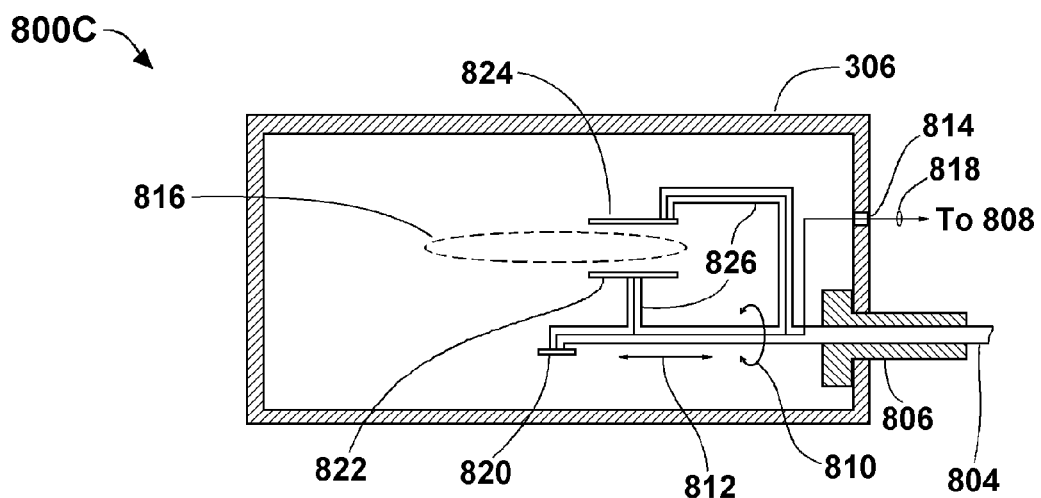
FIG. 8C shows a cross-sectional view of a portion of the system of FIG. 8A illustrating details of a second operating position of the embodiment.

Referring to FIGS. 8A and 8B, the conductive portion 306 of the vacuum chamber 304 encloses a beam 816 traveling into the plane of the paper (FIG. 8B) and indicated by its cross-sectional shape (in this example, elliptical). For convenience, distances along the long axis of the cross-sectional ellipse of the beam 816 will be referred to as radial distances and distances along the short axis of the cross-sectional ellipse of the beam 816 will be referred to as vertical distances. In this embodiment signals equivalent to those described above in connection with FIG. 3B may be detected on one or more movable electrodes attached to a movable probe (comprising 804, 820, 822, 824, 826, and 828). (Note that 824 and 826 are not shown in FIG. 8B because they are obscured by the shaft of the actuator. They are shown unobscured in FIG. 8C.) An actuator 802 may be a rotary and linear motion actuator for imparting both a rotary motion 810 and a linear motion 812 to a shaft 804 of the movable probe. The rotary motion 810 may be cyclical and may be stepwise or continuous. The linear motion 812 may be reciprocating and may be stepwise or continuous. The rotary motion rotates the shaft so as to move electrodes such as 820, 822 and 824 as shown for example in FIGS. 8B and 8C. The linear motion displaces the electrodes such as 820, 822 and 824 in a radial direction relative to the vacuum chamber, that is to the left or right in FIGS. 8B and 8C. A controller 808 controls the motion of the movable probe and comprises instrumentation for receiving and processing signals received from the movable probe. Diagnostic signals flow to controller 808 and control signals flow from controller 808 on cable 818. The controller 808 may be purpose-built and/or may comprise a general-purpose control system that may comprise microcomputers or other computer systems and may communicate with other systems not shown. The shaft 804 is fed through the walls of the conductive portion 306 of the vacuum chamber 304 by a conventional hermetic vacuum feedthrough 806 that allows transmission of both the rotary motion 810 and the linear motion 812. The vacuum feedthrough 806 may be of any of many traditional means that are well known to those experienced in the art and may include components such as for example, not limitation, bellows, ferrofluidic seals, sliding seals, etc. The probe has a conductive electrode 820 that is arranged on a support 828 attached to the shaft 804. FIG. 8B shows the conductive electrode 820 in a position such that it intercepts a portion of the beam 816 for sampling beam current at the intercepted portion of the beam 816. The actuator 802 may provide linear motion 812 to sample the beam 816 at different positions. The conductive electrode 820 can be positioned to intercept the beam in some orientations to measure the current at various radial distances by using the linear motion 812. The vertical size of the beam 816 at different radial distances can be measured as well. By rotation of the shaft 804 using the rotary motion 810, the conductive electrode can be made to extend different vertical distances into the beam 816. As shown in FIG. 8B, the conductive electrode 820 intercepts the entire vertical extent of the sampled portion of the beam 816. Rotation to other angles can achieve a partial interception of the beam by only partially penetrating the beam in the vertical direction and by measuring the intercepted beam current as a function of the angle of the rotary motion 810, the vertical beam current profile at any given radial distance may be determined by controller 808.

FIG. 8C shows the movable probe in a different position such that the rotary motion 810 has rotated the device 90 degrees with respect to the position shown in FIG. 8B. In the position of FIG. 8C, the conductive electrode 820 has been rotated to a position such that it does not intercept any of the beam 816, while one or more conductive electrodes (822, 824) supported on supports (826) are rotated into positions such that they are positioned above and below the beam 816 in the vertical direction. (Note that 828 is not shown in FIG. 8C because it is obscured by other components in this view. It is shown unobscured in FIG. 8B.) The conductive electrodes 822 and/or 824 are of the same type and function as the conductive electrodes 336 shown in FIG. 3B and described above. Conductive electrodes 822 and 824 may each be individual electrodes or may be arrays of conductive electrodes. Conductive electrodes 822 and 824 can be moved by the actuator 802 in the direction of the linear motion 812 for sampling signals induced in the conductive electrodes 822 and 824 at various radial distances of the beam 816.

By using the movable probe described in FIGS. 8A, 8B, and 8C, cross-sectional characteristics of the beam 816 can be sampled for its entire cross-sectional extent. The movable probe may be controllably operated as either an intercepting or a non-intercepting diagnostic. The movable probe may be beam-intercepting in some positions and may be beam non-intercepting in other positions. The movable probe has been shown in one exemplary configuration, but other configurations are possible and will be recognized by those skilled in the art and are intended to be encompassed by this disclosure. In one alternate configuration, the probe may be non-intercepting in orientations at both 90 degrees and 180 degrees compared to FIG. 8B, for sensing electrically induced signals in two different positions. Comparing the induced signals in the two positions allows a determination of both the vertical location of the beam and the total charge as a function of location. In this case the signals could also be detected on two or more insulated non-intercepting conductive electrodes 822, 824 moved to straddle the beam above and below when the intercepting conductive electrode 820 is rotated out of the beam 816. These different functionalities would be derived from electrodes placed at different locations along the axis of the shaft 804 of the movable probe. All the functions and information described above can be derived by such measurements using electrodes mounted on a movable probe moved to different positions.

Although the methods and systems have been described relative to specific embodiments thereof, they are not so limited. Obviously many modifications and variations may become apparent in light of the above teachings.

While the systems and methods disclosed herein have been particularly shown and described with references to exemplary embodiments thereof, it will be understood by those skilled in the art that various changes in form and details may be made therein without departing from the scope of the disclosure. It should be realized this disclosure is also capable of a wide variety of further and other embodiments within the spirit of the disclosure. Those skilled in the art will recognize or be able to ascertain using no more than routine experimentation, many equivalents to the exemplary embodiments described specifically herein. Such equivalents are intended to be encompassed in the scope of the present disclosure.

The invention claimed is:

1. An apparatus for obtaining diagnostic information about a particle beam circulating in an accelerator, comprising:
 a) for at least one location on a circumference of a vacuum chamber comprising a part of the accelerator, at least one fixed conducting electrode disposed inside the vacuum chamber;
 b) for each fixed conducting electrode, a lead connected thereto; and
 c) at least one feedthrough on a surface of the vacuum chamber;
 wherein the vacuum chamber encloses an evacuated region;
 wherein the vacuum chamber encircles a portion of an induction core;
 wherein the vacuum chamber comprises an electrically conductive portion and a non-conducting gap;
 wherein each fixed conducting electrode communicates through the lead connected to it to information gathering means disposed outside the vacuum chamber;
 wherein each lead passes from inside the vacuum chamber to outside through a feedthrough; and
 wherein each fixed conducting electrode is fixed in location, and is disposed so as to be in position to sense electromagnetically the particle beam circulating in the evacuated region in the vacuum chamber and accelerated by a voltage imposed across the non-conducting gap, and is disposed so as to not to intercept the particle beam.

2. A method for obtaining diagnostic information about a particle beam circulating in an accelerator, comprising:
 a) for at least one location on a circumference of a vacuum chamber comprising a part of the accelerator, disposing at least one fixed conducting electrode inside the vacuum chamber;
 wherein the vacuum chamber encloses an evacuated region;
 wherein the vacuum chamber encircles a portion of an induction core;
 wherein the vacuum chamber comprises an electrically conductive portion and a non-conducting gap; and
 wherein each fixed conducting electrode is fixed in location, and is disposed so as to be in position to sense electromagnetically the particle beam circulating in the evacuated region in the vacuum chamber and accelerated by a voltage imposed across the non-conducting gap, and is disposed so as to not to intercept the particle beam;
 b) for each fixed conducting electrode, disposing a lead connected thereto;
 wherein each fixed conducting electrode is disposed to communicate through the lead connected to it to information gathering means disposed outside the vacuum chamber;
 c) disposing at least one feedthrough on a surface of the vacuum chamber;
 wherein each lead passes from inside the vacuum chamber to outside through a feedthrough; and
 d) transmitting from at least one of the fixed conducting electrodes through the lead connected thereto to the information gathering means a signal comprising information about at least one characteristic of the beam from the group consisting of: a number of turns the beam has traversed around the vacuum chamber; a position of the beam around a circumference of the vacuum chamber; a radial position of the beam in the vacuum chamber; a vertical displacement of the beam in the vacuum chamber; a location of an orbit of the beam in the vacuum chamber; an energy of the beam; and a loss of the beam.

\* \* \* \* \*